United States Patent

[11] 3,628,187

[72] Inventors Bernard C. De Loach, Jr.
Murray Hill;
Roger Edwards, Gillette, both of N.J.

[21] Appl. No. 883,898
[22] Filed Dec. 10, 1969
[45] Patented Dec. 14, 1971
[73] Assignee Bell Telephone Laboratories Incorporated
Murray Hill, N.J.

[54] NEGATIVE RESISTANCE AVALANCHE DIODES WITH SCHOTTKY BARRIER CONTACTS
4 Claims, 2 Drawing Figs.

[52] U.S. Cl. ........ 331/107 R, 317/235 T, 317/235 UA
[51] Int. Cl. ........ H03b 7/06
[50] Field of Search ........ 317/235 T, 235 VA; 331/107 R

[56] References Cited

UNITED STATES PATENTS 3,519,999 7/1970 Gregor ........ 317/235

OTHER REFERENCES

Sze et al., " Metal-Semiconductor Impatt Diode" Pgs. 107–109, Feb. 1969, Solid-State Electronics

*Primary Examiner*—John Kominski
*Attorneys*—R. J. Guenther and Arthur J. Torsiglieri

ABSTRACT: A negative resistance avalanche diode comprises only a bulk semiconductor wafer contained between opposite Schottky barrier contacts.

INVENTORS B. C. DE LOACH, JR.
R. EDWARDS
BY

ATTORNEY

NEGATIVE RESISTANCE AVALANCHE DIODES WITH SCHOTTKY BARRIER CONTACTS

BACKGROUND OF THE INVENTION

This invention relates to negative resistance diode oscillators, and more particularly, to avalanche diode oscillators.

The Read U.S. Pat. No. 2,899,652 describes how a multilayer avalanche diode can be made to present a negative resistance and, when placed in a proper resonant circuit, generate microwave oscillations. An applied direct current voltage periodically biases a PN-junction to avalanche breakdown, thereby creating current pulses each of which travels across a transit region within a prescribed time period. This transit time is arranged with respect to the resonant frequency of the external resonator such that RF voltages at the diode terminals are out of phase with current pulses in the diode. With an appropriately designed phase shift, the current through the terminals increases as the voltage across the terminals decreases, thus establishing a negative resistance. Ultimately, part of the DC energy applied to the diode is converted to RF energy in the resonator and the circuit constitutes the solid-state microwave source.

Improved microwave oscillator avalanche diodes, now known as IMPATT diodes, are described in the paper "The IMPATT Diode—A Solid-State Microwave Generator," *Bell Labs Record*, by K. D. Smith, Vol. 45, May 1967, page 144; the paper "Microwave Si Avalanche Diode with Nearly Abrupt Type Junction," by T. Misawa, *IEEE Transactions on Electron Devices*, Vol. ED–14, Sept. 1967, page 580; and the B. C. De Loach, Jr., et al. U.S. Pat. No. 3,270,293. Whereas the Read diode is a four-layer device, the newly developed IMPATT diode is typically a $p+Yn+$ or $n+\pi p+$ diode with only three layers. The newer IMPATT diodes are usually capable of higher efficiency than IMPATT diodes of the Read configuration.

The copending application of De Loach et al., Ser. No. 854,678, filed Sept. 2, 1969, describes how even higher efficiencies can be achieved by using an IMPATT diode in a cavity resonator having a resonance at the normal IMPATT frequency $f_i$ and also a high Q resonance at an output frequency $f_i/n$, where $n$ is an integral number. This mode of oscillator operation is known as the TRAPATT mode, an acronym for trapped plasma avalanche triggered transit.

Regardless of the mode of operation, avalanche diode continuous-wave power output is limited mainly by heat generated. As the frequency of operation is increased, wafer diameter must invariably decrease, the wafer becomes more susceptible to heating, and power capacities are reduced. Efficiency is also a prime consideration, and, to reduce series resistance, the contacts to the diode are invariably ohmic contacts. To make an ohmic or nonrectifying contact, it is generally necessary to use a high conductivity semiconductor in a transition region between the metal contact and the lower conductivity active region of the diode.

SUMMARY OF THE INVENTION

We have found that a negative resistance avalanche diode can be made merely by applying Schottky barrier contacts to opposite sides of a bulk semiconductor wafer of constant homogeneous conductivity. As is known, a Schottky barrier contact is a contact of metal to semiconductor which forms a rectifying barrier or junction, as opposed to an ohmic or nonrectifying contact. Our diode operates in the same manner as conventional avalanche diodes except that the entire semiconductor wafer between opposite metal contacts constitutes the active, or current transit, region. The diode is used with virtually the same external circuitry as would conventional diodes.

The direct current bias across our Schottky barrier avalanche diode reverse biases one of the Schottky barrier junctions, which shall be known as the front contact and forward biases the other, which is the rear contact. The front contact is reverse biased beyond avalanche, and, as described before, a current pulse is formed which travels across the wafer transit region within a prescribed time period. The rear contact is, of course, a rectifying contact rather than an ohmic contact; but both experiment and theory have shown that this does not appreciably increase the series resistance of the diode. Thus, the efficiency of the device is comparable to that of conventional negative resistance avalanche diodes. Our studies indicate that our diode can be used in various circuits to give a number of desired modes of operation such as the TRAPATT mode, in a manner which would be obvious to one skilled in the art.

The primary advantage of our diode configuration is that it permits the use of bulk semiconductors of constant conductivity, rather than requiring epitaxial layers, or diffused or ion-implanted PN-junctions. This ideally permits one to use semiconductors such as diamond which are desirably high in thermal conductivity but in which PN-junctions cannot readily be formed. It also offers obvious advantages of convenience of fabrication and control of both the thickness and impurity density of the wafer. Moreover, it permits heat to be extracted from both sides of the active semiconductor region; the thermal path to both metal contacts is reduced to a minimum. These and other objects, features, and advantages of the invention will be better understood from a consideration of the following detailed description, taken in conjunction with the accompanying drawing.

DRAWING DESCRIPTION

FIG. 1 is a schematic diagram of a negative resistance avalanche diode oscillator circuit; and FIG. 2 is a schematic illustration of a negative resistance avalanche diode used in the circuit of FIG. 1.

DETAILED DESCRIPTION

Figure 1:
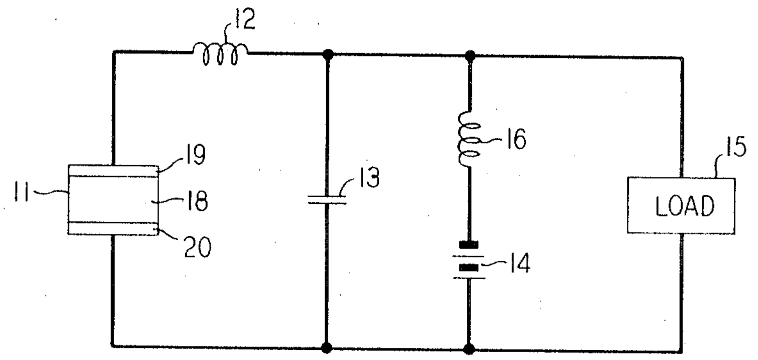

Referring now to FIG. 1, there is shown an oscillator circuit comprising a negative resistance avalanche diode 11 connected to an inductance 12, a capacitance 13, a battery 14, and a load 15. The inductance 12 and capacitance 13 together constitute a resonant circuit which establishes an output frequency to be generated by the diode 11 and delivered to the load 15. A radiofrequency choke 16 isolates battery 14 from the high-frequency output current.

The diode 11 operates as an IMPATT diode. That is, a rectifying junction in the diode is reverse biased by battery 14 to avalanche breakdown, thus creating a current pulse which travels across a semiconductor transit region within a prescribed time period. After the current pulse has completed its transit, the junction again is biased to avalanche breakdown, another current pulse is formed and the process repeats itself. The transit time is arranged with respect to the resonant frequency of the external resonator such that radiofrequency voltages at the diode terminals are out of phase with the current pulses in the diode. This establishes a negative resistance so that direct current energy from battery 14 can be converted to radiofrequency energy, as is required in any oscillator.

Figure 2:
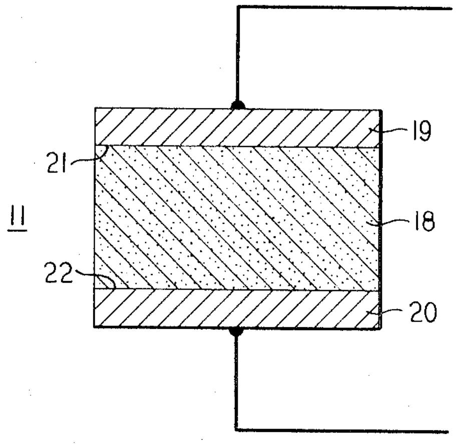

As shown more clearly in FIG. 2, the diode 11 comprises a wafer 18 of bulk semiconductor and two Schottky barrier contacts 19 and 20. Since the contacts are Schottky barrier contacts, they respectively form rectifying junctions 21 and 22 with the wafer. In the circuit of FIG. 1, wafer 18 is of N-type conductivity and the battery 14 reverse biases junction 21 and forward biases junction 22. The reverse bias is sufficient to cause periodic avalanching and a resultant transit time negative resistance as described before. Note that the entire wafer 18 constitutes the active transit region of the diode; current pulses travel from front contact 19 to rear contact 20.

The primary advantage of the diode configuration of FIG. 2 is that wafer 18 is a bulk semiconductor of constant conductivity. Since no PN-junction in the wafer is required, the invention permits new semiconductors, such as diamond and cadmium sulfide, to be used. It also offers obvious advantages of convenience of fabrication and control of both the thickness and impurity density of the wafer.

The manner in which the Schottky barrier contacts 19 and 20 are formed on the diode are within the ordinary skill of the worker in the art. The wafer may be of the usual semiconductor materials such as silicon, germanium or gallium arsenide, and the contacts may be of a number of appropriate metals. The contacts should, of course, be uniform, not be "leaky," and otherwise conform to good engineering practice. Both experiment and practice show that the back contact 20 will not constitute a large series resistance to the diode current and will not substantially degrade efficiency. The RF resistance is small because the capacitance per unit area of a forward-biased Schottky barrier junction is large and almost completely shunts the junction resistance. The DC resistance is small because the DC voltage across a forward-biased Schottky barrier junction is small. As mentioned before, our diode may be used in circuits other than that shown in FIG. 1, and is particularly well suited for use in the TRAPATT oscillator circuit.

A typical N-type silicon diode with platinum silicide Schottky barrier contacts may be made with the following parameters:

wafer thickness ≈ 7 microns;
wafer diameter ≈ mils;
contact diameter ≈ 10 mils;
wafer doping level ≈ $3\times10^{15}$ carrier/centimeter$^3$; and
operating frequency ≈ 9 gigaHertz.

Silicon carbide is also promising as a wafer material because of its high thermal conductivity and other factors.

Various other embodiments and modifications may be devised by those skilled in the art without departing from the spirit and scope of the invention.

What is claimed is:

1. In a high-frequency oscillator of the type comprising a semiconductor junction diode, means for reverse biasing the diode to avalanche breakdown, means for defining a semiconductor current transit region, said diode being located in an oscillator circuit resonant at a frequency related to the transit time of the transit region, the improvement wherein:
the diode comprises a wafer of semiconductor material contained between first and second contacts;
the first and second contacts each forming a Schottky barrier with the semiconductor wafer.

2. The improvement of claim 1 wherein:
the wafer consists of bulk semiconductor material of substantially constant conductivity with no PN-junctions.

3. The improvement of claim 2 wherein:
the wafer is made of a material in which it is substantially impossible to form a PN-junction.

4. The improvement of claim 3 wherein:
the wafer is made of diamond.

* * * * *